United States Patent [19]

Hall et al.

[11] Patent Number: 4,570,120
[45] Date of Patent: Feb. 11, 1986

[54] N.M.R. IMAGING

[75] Inventors: Laurance D. Hall; Subramaniam Sukumar, both of Vancouver, Canada

[73] Assignee: The University of British Columbia, Vancouver, Canada

[21] Appl. No.: 488,414

[22] Filed: Apr. 25, 1983

[51] Int. Cl.⁴ ............................................. G01R 33/08
[52] U.S. Cl. ..................................... 324/309; 324/307
[58] Field of Search ................ 324/300, 307, 311, 309

[56] References Cited

U.S. PATENT DOCUMENTS

| | | | |
|---|---|---|---|
| 4,115,730 | 9/1978 | Mansfield | 324/309 |
| 4,318,043 | 3/1982 | Crooks | 324/309 |
| 4,431,968 | 2/1984 | Edelstein | 324/309 |

Primary Examiner—Michael J. Tokar
Attorney, Agent, or Firm—Gordon M. Stewart

[57] ABSTRACT

A method of obtaining an N.M.R. image of a specimen slice in the a-b plane is provided. The method comprises tipping the magnetization vector by an angle other than 180°. The magnetization is then repeatedly reversed 180° so as to produce a spin echo train. Simultaneously with the preceding steps, $G_a$ and $G_b$ sequences are applied in which the values of $G_a$ and $G_b$ remain constant over each spin echo while the absolute values or preferable their actual values thereof change from respective adjacent spin echoes, preferably incrementally in co-sinusoidal relationship. The tipping and reversing of the magnetization vector is preferably accomplished by means of rf pulses.

27 Claims, 2 Drawing Figures

N.M.R. IMAGING

FIELD OF THE INVENTION

This invention relates to an N.M.R. imaging technique for obtaining an image of a specimen slice in a relatively short period of time.

DESCRIPTION OF PRIOR ART

The concept of NMR imaging particularly in the biological and medical fields is now fairly well-known. In the conventional projection-reconstruction imaging technique, a plurality of 90° rf pulses each typically of in the order of tenths of microseconds duration are provided to produce a series of free induction decays (FID). During any given FID a magnetic gradient is provided which will have components in both axes of the image plane. The magnetic gradient is at a different angle for each FID, usually over a total of 180° or 360° so as to produce a plurality of projections from which an image slice can be reconstructed. The primary difficulty with the foregoing method is that in order to avoid saturation and consequent loss of signal, a time delay between each 90° pulse must be allowed which is typically in the order of about five times $T_1$ (the spin-lattice relaxation time). As $T_1$ in a typical biological specimen is about 100 to 500 milliseconds in duration, then a period of time in the vicinity of 2.5 seconds between each 90° pulse, and hence between the obtaining of each projection, is required. To obtain a typical image slice, 180 projections might be required thereby requiring about seven minutes to obtain the data for such an image of a specimen slice. One possible method which would alleviate the foregoing problem was suggested by Mansfield et al. in *Journal of Magnetic Resonance,* 29,355-737 (1978). The method suggested though requires switching of very large magnetic field gradients. Such switching of such large field gradients is technically difficult to achieve and may be undesirable as it has been suggested that there may be adverse physiological consequences. In addition, a particular apparatus constructed to utilize the method described by Manfield et al. will suffer from the disadvantage that the maximumum degree of resolution which can be obtained by such apparatus applying the foregoing method, is limited by the physical characteristics of such apparatus, namely the strenth of maximum field gradients which can be switched as required.

SUMMARY OF THE INVENTION

The present invention provides a metod of obtaining an NMR image of a specimen slice in the a-b plane. In a typical medical imaging apparatus the a-b plane will be defined as the x-y plane with the static magnetic field defining the z axis. However, the present method is not limited to obtaining an image of a specimen slice in the x-y plane. In discussing the method throughout this application it will be assumed that the otherwise usual steps in obtaining an NMR image of a specimen slice have been taken care of. For example, establishment of the specimen slice by known means such as an oscillating z gradient or applying a tailored (i.e. containing only the appropriate frequency range for the slice of interest) rf pulse in the presence of a z-axis gradient.

The present method then comprises tipping the magnetization vector by an angle other than 180°. This is followed by repeatedly reversing the magnetization vector by 180° so as to produce a spin echo train. Simultaneously with the latter step, $G_a$ and $G_b$ sequences are applied in which the values of $G_a$ and $G_b$ remain constant over each spin echo while the absolute values thereof change from respective spin echoes. Preferably, such changes are incremental and regular from respective spin echoes, further preferably in inverse relationship, advantageously in an inverse sinusoidal relationship.

Usefully, $G_a$ and $G_b$ change in co-sinusoidal realtionship, that is one is in the form of a cosine wave while the other is in the form of a sine wave, or in other words both are sine waves 90° out of phase, and the tipping and reversing of the magnetization vector is accomplished by means of the rf pulses.

Advantageously, the magnetization vector is tipped substantially 90°.

In order to obtain $T_2$ (spin-spin relaxation) data for at least one projection, the method advantageously includes application of at least one set of $G_a$ and $G_b$ values a plurality of times over a time period less than $T_2$.

The method further usefully additionally comprises first tipping the magnetization vector 180° followed by a selected time delay prior to tipping the magnetization vector by other than 180°, again preferably by 90°, so as to produce $T_1$ contrasted projection data.

Usefully, the tipping and reversing of the magnetization vector, and application of field gradients are repeated with a time delay substantially greater than $T_1$ between each tipping step, and with the same values of $G_a$ and $G_b$ being provided as in the first sequence but in reverse order.

A selected time delay can advantageously be provided between the tipping and reversing steps, so as to produce $T_2$ contrasted projection data.

The present invention also provides an apparatus for performing the preceding method.

DRAWINGS

The embodiments of the invention will now be described with reference to the drawings in which:

FIG. 1 shows typical incrementally stepped field gradients utilized in conjunction with the spin echo train, as shown in a method of the present invention; and FIG. 2 is an image reconstruced using the filtered back-projection procedure, from data acquired in the experiment of FIG. 1.

DETAILED DESCRIPTION OF THE EMBODIMENTS OF THE INVENTION

Figure 1:
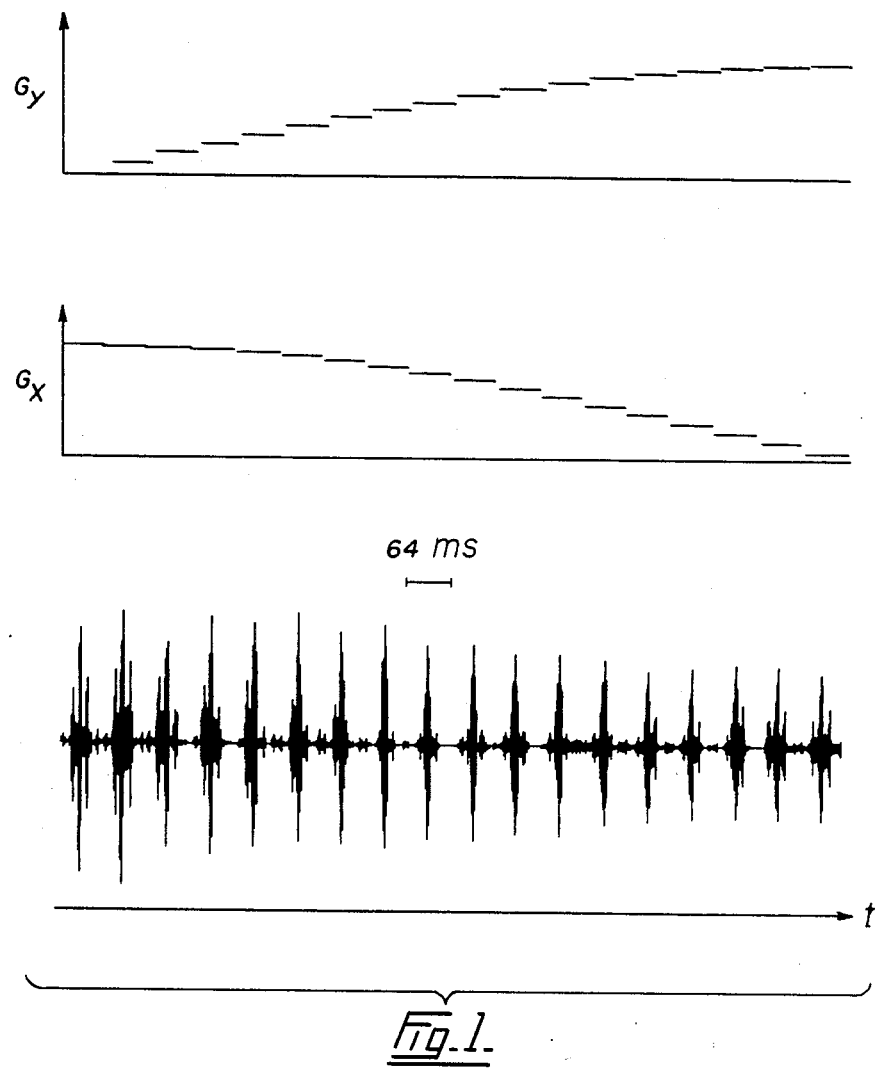
Figure 2:
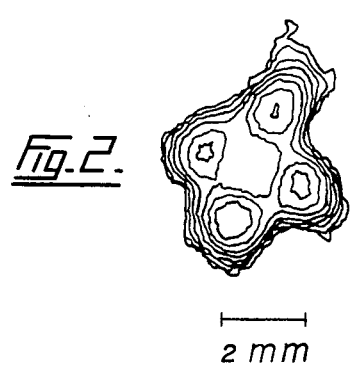

In an embodiment of the method of the present invention, a suitable specimen slice is defined by a known means. The magnetization vector of the specimen slice is then tipped 90° by means of an rf pulse of about 10 microseconds duration. Following the foregoing a series of spin echoes are obtained by repeatedly reversing the magnetization vector of the specimen slice 180° by means of 180° rf pulses. Simultaneously with the foregoing $G_x$ and $G_y$ sequences are applied in which the values of each of $G_x$ and $G_y$ change incrementally and in an co-sinusoidal relationship from respective adjacent spin echoes. The relationship of $G_x$ and $G_y$ with the spin echoes is shown in FIG. 1. FIG. 1 shows actual data required from a sample containing 4 water-filled capillary tubes each having a 1.2 mm. and 1.5 mm. inside and outside diameters respectively. As shown in the Figure, the gradients were rotated through 0° to 90° in the x-y plane. The block-size was 8192, dwell time 500 microseconds, sampling time 2 seconds, relaxation delay 10 seconds, and with a field gradient of 0.1 G/cm. In order to produce the reconstructed image in FIG. 2, two acquisitions as described were obtained. In addition, the entire foregoing sequence was repeated with the gradient being rotated from 90° to 180°. Each of the resultant whole-echo signals corresponds to a different image projection with the entire set of echoes being Fourier transformed and sorted using spin-echo absorption spectroscopy protocol as described by Bax et al. in *J. Magn. Reson*, 35,373 (1979), and Hall et al. in *J. Magn. Reson*, 38, 559 (1980). The image of FIG. 2 was obtained using the standard filtered back projection method. Phase alternation of the 180° pulses was used to minimize the effect of pulse imperfections as described by Freeman et al. in *Proc. Colleq AMPERE At. Mol. Etud. Radio Elec.*, 15,205 (1969). Total data acquisition time for the experiment was 36 seconds versus about 14 minutes which would have been required for comparable results utilizing a conventional method as previously described.

In order to minimize distortion of the resulting back projected image, the necessary data for the projections should be collected before there is any significant magnetization loss due to $T_2$. Thus, it will be advantageous to use higher values of field gradients particularly where $T_2$ is relatively short. Another possible means of minimizing distortion due to $T_2$ would be by appropriate scaling of the echo intensities provided that for the specimen in question the $T_2$ values of the spins are similar.

A further possible way to minimize distortion due to $T_2$ is to repeat the entire sequence of steps with a time delay substantially greater than $T_1$ (i.e. usually about $5 \times T_1$) between each initial 90° pulse. During such repeated sequence, the same $G_x$ and $G_y$ values as in the first sequence would be utilized, but in reverse order (i.e. by rotating the gradient back to 0° in an anti-clockwise direction).

It is possible in the above method to obtain $T_2$ data for any number of projections by applying the corresponding values of $G_x$ and $G_y$ a plurality of times over a time period less than $T_2$. The $T_2$ data for each projection can then be calculated from the decrease in intensities. In addition, $T_1$ contrasted projection data can be obtained by the method by initially tipping the magnetization vector 180° by means of an rf pulse for example, followed by a selected time delay of less than about $5T_1$ prior to application of the 90° pulse. To produce $T_2$ contrasted projection data, a selected time delay usually substantially less than about $5T_2$, is provided between the initial 90° rf pulse and the subsequent train of 180° rf pulses. The longer the foregoing time delay, other factors remaining the same, the greater will be the $T_2$ contrast, bearing in mind though that sensitivity will decrease with increased delays. In any of the methods described, image quality can be improved by taking more projections.

It should be noted that the above method may encounter limitations when extended to larger samples of biological tissue as a result of variations of radio frequency-phase and power loss, as described by Bottomley et al. *Phys. Med. Biol.*, 23 630 (1978), although composite pulses have been suggested by Levitt et al. in *J. Magn. Reson*, 43 65 (1981) for compensating for rf power loss in the sample. It will be understood throughout this application then that when "rf pulses" are referred to, such term includes an appropriate composite pulse.

It should be noted that the present method can be implemented on most existing NMR imaging systems simply by changing the data acquisition programs and rf pulse and gradient sequences. The second means and field gradient means described in the apparatus of the present invention, refers to appropriately programmed rf pulse and gradient sequence controls. Of course, it will be understood that such will be utilized in conjunction with the usual field coils (static and gradient), and rf transmitter and receiver. In addition, as described above, the method can be easily modified to suit the particular specimen being studied. Thus, the method of the present invention can be modified so that a user then is not limited in the data which he can acquire as a result of hardware parameters.

Other variations to the method described are of course possible. For example, the magnetization vector of the specimen slice can be reversed by reversing $G_x$ and $G_y$ from adjacent respective spin echoes while the absolute values of $G_x$ and $G_y$ change incrementally in co-sinusoidal relationship as previously described, rather than using rf pulses.

As will be apparent to those skilled in the art in light of the foregoing disclosure, many alterations and modifications are possible in the practice of this invention without departing from the spirit or scope thereof. Accordingly, the scope of the invention is to be construed in accordance with the substance defined by the following claims.

We claim:

1. A method of obtaining an NMR image of a specimen slice in the a-b plane, comprising:
   (a) tipping the magnetization vector throughout the slice by an angle other than 180°;
   (b) then, repeatedly reversing the magnetization vector 180° throughout the slice so as to produce a spin echo train from the slice;
   (c) simultaneously with step (b) applying $G_a$ and $G_b$ sequences in which the values of $G_a$ and $G_b$ remain constant over each spin echo while the absolute values thereof change from respective adjacent spin echoes.

2. A method as described in claim 1 wherein the absolute values of $G_a$ and $G_b$ changes incrementally and regularly from adjacent respective spin echoes.

3. A method as described in claim 2 wherein the absolute values of $G_a$ and $G_b$ change incrementally and regularly in inverse relationship from respective spin echoes.

4. A method as described in claim 3 wherein the absolute values of $G_a$ and $G_b$ change in co-sinusoidal relationship from respective spin echoes.

5. A method as described in claim 3 wherein $G_a$ and $G_b$ change in co-sinusoidal relationship and wherein the tipping and reversing of the magnetization vector is accomplished by means of rf pulses.

6. A method as described in claim 1, 2, or 5 wherein the magnetization vector is tipped substantially 90°.

7. A method as described in claim 1, 2, or 3 wherein at least one set of $G_a$ and $G_b$ values are applied a plurality of times over a time period less than about $T_2$ so as to provide $T_2$ data for a plurality of projections.

8. A method as described in claim 1, 2, or 3 wherein at least one set of $G_a$ and $G_b$ values are applied a plurality of times over a time period less than about $T_2$ so as to provide $T_2$ data for a plurality of projections, and wherein the magnetization vector is tipped substantially 90°.

9. A method as described in claim 4 or 5 wherein at least one set of $G_a$ and $G_b$ values are applied a plurality of times over a time period less than about $T_2$ so as to provide $T_2$ data for a plurality of projections.

10. A method as described in claim 4 or 5 wherein at least one set of $G_a$ and $G_b$ values are applied a plurality of times over a time period less than about $T_2$ so as to provide $T_2$ data for a plurality of projections, and wherein the magnetization vector is tipped substantially 90°.

11. A method as described in claim 1, 2, or 3 additionally comprising first tipping the magnetization vector 180° followed by a selected time delay prior to step (a), so as to produce $T_1$ contrasted projection data.

12. A method as described in claim 4 or 5 additionally comprising first tipping the magnetization vector 180° followed by a selected time delay prior to step (a) so as to produce $T_1$ contrasted projection data.

13. A method as described in claim 1, 2, or 3 additionally comprising first tipping the magnetization vector 180° followed by a selected time delay prior to step (a), so as to produce $T_1$ contrasted projection data, and wherein the magnetization vector is tipped substantially 90° in step (a).

14. A method as described in claim 4 or 5 additionally comprising first tipping the magnetization vector 180° followed by a selected time delay prior to step (a), so as to produce $T_1$ contrasted projection data, and wherein the magnetization vector is tipped substantially 90° in step (a).

15. A method as described in claim 2, 4, or 5 additionally comprising repeating the sequence of step (a), (b) and (c) with a time delay substantially greater than $T_1$ between each step (a), and with the $G_a$ and $G_b$ values as in the first sequence of steps but in reverse order.

16. A method as described in claim 2, 4, or 5 additionally comprising repeating the sequence of step (a), (b) and (c) with a time delay substantially greater than $T_1$ between each step (a), and with the $G_a$ and $G_b$ values as in the first sequence of steps but in reverse order, and wherein the magnetization vector is first tipped in each sequence substantially 90°.

17. A method as described in claim 2, 4, or 5 wherein a selected time delay is provided between steps (a) and (b) so as to produce $T_2$ contrasted projection data.

18. Apparatus for obtaining an N.M.R. image of a specimen slice in the a-b plane, comprising:

(a) first means for tipping the magnetization vector throughout the slice by an angle other than 180°;
(b) second means for repeatedly reversing the magnetization vector 180° throughout the slice so as to produce a spin echo train from the slice;
(c) field gradient means for applying $G_a$ and $G_b$ sequences in which the values of $G_a$ and $G_b$ remain constant over each spin echo while the absolute values thereof change from respective adjacent spin echoes.

19. An apparatus as described in claim 18 wherein said field gradient means can apply $G_a$ and $G_b$ sequences in which the absolute values of $G_a$ and $G_b$ change incrementally and regularly from respective spin echoes.

20. An apparatus as described in claim 19 wherein said field gradient means can apply $G_a$ and $G_b$ sequences in which the absolute values of $G_a$ and $G_b$ change incrementally and regularly in inverse relationship from respective spin echoes.

21. An apparatus as described in claim 20 in which said field gradient means can apply $G_a$ and $G_b$ sequences in which the absolute values of $G_a$ and $G_b$ change in co-sinusoidal relationship from respective spin echoes.

22. An apparatus as described in claim 20 wherein said field gradient means can apply $G_a$ and $G_b$ sequences in which $G_a$ and $G_b$ change in co-sinusoidal relationship from respective spin echoes, and wherein, said first means and said second means both comprise rf sources.

23. An apparatus as described in claim 18, 19, or 22 wherein said first means can tip the magnetization vector substantially 90°.

24. An apparatus as described in claim 18, 19, or 20 wherein said field gradient means can apply at least one set of $G_a$ and $G_b$ values a plurality of times over a time period less than $T_2$.

25. An apparatus as described in claim 18, 19 or 22 wherein said field gradient means can apply at least one set of $G_a$ and $G_b$ values a plurality of times over a time period less than $T_2$, and wherein said first means can tip the magnetization vector substantially 90°.

26. An apparatus as described in claim 18, 19 or 22 wherein said field gradient means can apply at least one set of $G_a$ and $G_b$ values a plurality of times over a time period less than $T_2$.

27. An apparatus as described in claim 19 or 20 wherein said field gradient means can apply at least one set of $G_a$ and $G_b$ values a plurality of times over a time period less than $T_2$, and wherein said first means can tip the magnetization vector substantially 90°.

* * * * *